United States Patent
Oh et al.

(10) Patent No.: US 11,839,033 B2
(45) Date of Patent: Dec. 5, 2023

(54) METHOD OF DIRECTLY PATTERNING STRETCHABLE SUBSTRATE AND STRETCHABLE ELECTRODE FABRICATED BY THE SAME

(71) Applicant: Korea University Research and Business Foundation, Seoul (KR)

(72) Inventors: Soong Ju Oh, Seoul (KR); Jun Sung Bang, Goyang-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 17/728,234

(22) Filed: Apr. 25, 2022

(65) Prior Publication Data

US 2022/0386477 A1 Dec. 1, 2022

(30) Foreign Application Priority Data

May 28, 2021 (KR) .......................... 10-2021-0068786

(51) Int. Cl.
*H05K 1/00* (2006.01)
*H05K 1/02* (2006.01)
(Continued)

(52) U.S. Cl.
CPC .......... *H05K 3/389* (2013.01); *H05K 1/0283* (2013.01); *H05K 3/064* (2013.01); *H05K 3/381* (2013.01); *H05K 1/092* (2013.01)

(58) Field of Classification Search
CPC .......... H05K 1/00; H05K 1/02; H05K 1/0283; H05K 1/092; H05K 3/06; H05K 3/064;
(Continued)

(56) References Cited

U.S. PATENT DOCUMENTS

2012/0263771 A1\* 10/2012 Carlson ............... D06M 13/332
514/357
2013/0210148 A1\* 8/2013 Gracias .................... H01Q 1/38
216/41
(Continued)

FOREIGN PATENT DOCUMENTS

KR 10-1242031 B1 3/2013
KR 10-2014-0057435 A 5/2014
(Continued)

OTHER PUBLICATIONS

Korean Notice of Allowance dated May 23, 2023 for corresponding Korean Patent Application No. 10-2021-0068786, 3 pages, English Machine Translation.
(Continued)

*Primary Examiner* — Xiaoliang Chen
(74) *Attorney, Agent, or Firm* — Hauptman Ham, LLP

(57) ABSTRACT

Disclosed are a method of directly patterning a stretchable substrate; and a stretchable electrode fabricated by the method. More particularly, the method of directly patterning a stretchable substrate includes: forming a hydrophilic group on a surface of a stretchable substrate by UV-ozone treatment; forming at least one layer to be etched on the hydrophilic group-formed stretchable substrate, wherein the at least one layer to be etched includes an adhesion enhancing material; forming a photoresist layer on the at least one layer to be etched; exposing the photoresist layer; and patterning the at least one layer to be etched using the exposed photoresist layer, wherein a carbon chain included in the adhesion enhancing material forms ether bonding (R—O—R) with a hydrophilic group formed on the surface of the stretchable substrate.

12 Claims, 6 Drawing Sheets

(51) Int. Cl.
- *H05K 3/06* (2006.01)
- *H03K 19/21* (2006.01)
- *A61K 8/06* (2006.01)
- *A61K 8/26* (2006.01)
- *A61K 8/89* (2006.01)
- *A61K 8/92* (2006.01)
- *A61K 8/891* (2006.01)
- *A61K 8/895* (2006.01)
- *A61Q 1/04* (2006.01)
- *A61Q 1/06* (2006.01)
- *H05K 3/38* (2006.01)
- *H05K 1/09* (2006.01)

(58) Field of Classification Search
CPC .......... H05K 3/383; H05K 3/389; H05K 2201/0154; H05K 2201/026; H05K 2201/0338; H03K 19/21; H10K 10/84; H10K 10/478; H10K 10/481; A61K 8/06; A61K 8/26; A61K 8/89; A61K 8/92; A61K 8/891; A61K 8/895; A61K 8/8152; A61Q 1/04; A61Q 1/06; Y02E 10/549; Y02P 70/50
USPC ............ 174/254; 216/41; 424/402, 405; 428/174, 195.1; 430/325; 435/396
See application file for complete search history.

(56) References Cited

U.S. PATENT DOCUMENTS

| | | | |
|---|---|---|---|
| 2017/0181953 A1* | 6/2017 | El-Khouri | A61Q 19/00 |
| 2017/0181954 A1* | 6/2017 | El-Khouri | A61K 8/26 |
| 2017/0181957 A1* | 6/2017 | El-Khouri | A61Q 1/06 |
| 2017/0181958 A1* | 6/2017 | El-Khouri | A61Q 1/06 |
| 2019/0157256 A1* | 5/2019 | Wang | H01L 27/016 |
| 2020/0212080 A1* | 7/2020 | Ahn | H01L 27/1446 |

FOREIGN PATENT DOCUMENTS

| | | |
|---|---|---|
| KR | 10-2017-0083885 A | 7/2017 |
| KR | 10-2018-0061800 A | 6/2018 |
| KR | 10-1887481 B1 | 8/2018 |
| KR | 10-1914382 B1 | 11/2018 |
| KR | 10-2189938 B1 | 12/2020 |
| KR | 10-2196345 B1 | 12/2020 |

OTHER PUBLICATIONS

Gokaltun et al., "Recent advances in nonbiofouling PDMS surface modification strategies applicable to microfluidic technology," Technology, Mar. 2017, vol. 5, No. 1, 12 pages.

* cited by examiner

METHOD OF DIRECTLY PATTERNING STRETCHABLE SUBSTRATE AND STRETCHABLE ELECTRODE FABRICATED BY THE SAME

CROSS-REFERENCE TO RELATED APPLICATION

This application claims priority to Korean Patent Application No. 10-2021-0068786, filed on May 28, 2021 in the Korean Intellectual Property Office, the disclosure of which is incorporated herein by reference.

BACKGROUND OF THE DISCLOSURE

Field of the Disclosure

The present disclosure relates to a method of directly patterning a stretchable substrate and a stretchable electrode fabricated by the method, and more particularly to a method of directly patterning a stretchable substrate whose low adhesion problem due to high surface stability is addressed by modifying a surface of the stretchable substrate and using an adhesion enhancing material; and a stretchable electrode fabricated by the method.

Description of the Related Art

Recently, research into stretchable electrodes with high utility based on various surface adhesion properties is being actively conducted. Such stretchable electrodes are being used in various fields, and the demand therefor is gradually increasing. In particular, PDMS has a high surface stability and has the advantage of being suitable for body application.

In the case of stretchable electrodes, patterning through a photolithography process is essential as a key component in the medical field such as biosignal extraction through electrocardiogram and electromyography, and in the electronic devices such as flexible displays, touchpads, energy devices, and solar cells.

To apply a stretchable electrode to various fields, it is necessary to pattern an electrode in a required shape on a stretchable substrate. However, PDMS, which is a typical example used as a stretchable substrate, has adhesive force to other materials due to high surface stability thereof, and thus, it is difficult to form another material in the form of a thin film on a surface thereof. Accordingly, a stretchable substrate has a fatal problem that it is difficult to coat with a photoresist layer and, accordingly, it is impossible to perform a photolithography process.

Therefore, when an electrode cannot be fabricated in a desired shape on a stretchable substrate, the utility of the stretchable electrode is very low despite of high performance thereof.

RELATED ART DOCUMENT

Patent Document

Korean Patent No. 2189938, "STRETCHABLE ELECTRODE, METHOD OF FABRICATING THE SAME AND FLEXIBLE ELECTRONIC DEVICE HAVING THE SAME"

SUMMARY OF THE DISCLOSURE

Therefore, the present disclosure has been made in view of the above problems, and it is an object of the present disclosure to provide a method of using a surface-modified stretchable substrate and at least one layer to be etched including an adhesion enhancing material to improve the adhesive force between the stretchable substrate and the at least one layer to be etched, thus directly patterning the stretchable substrate by a photolithography process.

It is another object of the present disclosure to provide a method of directly pattering a stretchable substrate, particularly a method of directly patterning a double layer formed on a stretchable substrate using a direct photolithography process, and a stretchable electrode fabricated by the method.

In accordance with an aspect of the present disclosure, the above and other objects can be accomplished by the provision of a method of directly patterning a stretchable substrate, the method including: forming a hydrophilic group on a surface of a stretchable substrate by UV-ozone treatment; forming at least one layer to be etched on the hydrophilic group-formed stretchable substrate, wherein the at least one layer to be etched includes an adhesion enhancing material; forming a photoresist layer on the at least one layer to be etched; exposing the photoresist layer; and patterning the at least one layer to be etched using the exposed photoresist layer, wherein a carbon chain included in the adhesion enhancing material forms ether bonding (R—O—R) with a hydrophilic group formed on the surface of the stretchable substrate.

The adhesion enhancing material may include a vinyl chain, wherein the vinyl chain of the adhesion enhancing material binds to the hydrophilic group formed on the surface of the stretchable substrate so that a pyrrolidone ring is formed on surface of the at least one layer to be etched.

The method may include forming at least one layer to be etched on the hydrophilic group-formed stretchable substrate, wherein the at least one layer to be etched includes an adhesion enhancing material; preparing a first solution including the adhesion enhancing material and a solvent; and coating the first solution on the hydrophilic group-formed stretchable substrate to form a first layer to be etched.

The adhesion enhancing material may form a hydrogen bond with the photoresist layer by oxygen included in the pyrrolidone ring.

A concentration of the first solution may be 5 wt % to 15 wt %.

The forming of the at least one layer to be etched on the hydrophilic group-formed stretchable substrate may include: coating the first solution on the hydrophilic group-formed stretchable substrate to form the first layer to be etched; and then forming at least one second layer to be etched on the first layer to be etched.

The forming of the at least one layer to be etched on the hydrophilic group-formed stretchable substrate may include: adding an adhesion enhancing material during synthesis of metal nanowires to prepare a second solution including the metal nanowires and the adhesion enhancing material; coating the second solution on the hydrophilic group-formed stretchable substrate to form a third layer to be etched; and forming a fourth layer to be etched including a metal on the third layer to be etched.

The adhesion enhancing material may be formed on a surface of the metal nanowires.

The adhesion enhancing material may become hydrophilic by oxygen included in the pyrrolidone ring so that adhesive force to a metal film increases.

In the forming of the hydrophilic group on a surface of a stretchable substrate by UV-ozone treatment, the UV-ozone treatment may be performed for 20 minutes to 60 minutes.

The stretchable substrate may include at least one of polydimethylsiloxane (PDMS), silicon rubber, polyurethane (PU), polyimide(polyimide, PI), polyethyleneterephthalate (PET), polyethylene naphthalate (PEN), epoxy, and Teflon.

The adhesion enhancing material may include polyvinylpyrrolidone (PVP).

In accordance with another aspect of the present disclosure, there is provided a stretchable electrode, including: a stretchable substrate whose surface includes a hydrophilic group; a first electrode pattern formed on the stretchable substrate whose surface includes a hydrophilic group, wherein the first electrode pattern includes an adhesion enhancing material; and a second electrode pattern formed on the first electrode pattern, wherein a carbon chain included in the adhesion enhancing material forms ether bonding (R—O—R) with a hydrophilic group formed on a surface of the stretchable substrate.

The adhesion enhancing material may include a vinyl chain, wherein the vinyl chain of the adhesion enhancing material binds to the hydrophilic group formed on the surface of the stretchable substrate so that a pyrrolidone ring is formed on the surface.

The adhesion enhancing material may become hydrophilic by oxygen included in the pyrrolidone ring so that adhesive force to the second electrode pattern increases.

The first electrode pattern may include metal nanowires.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
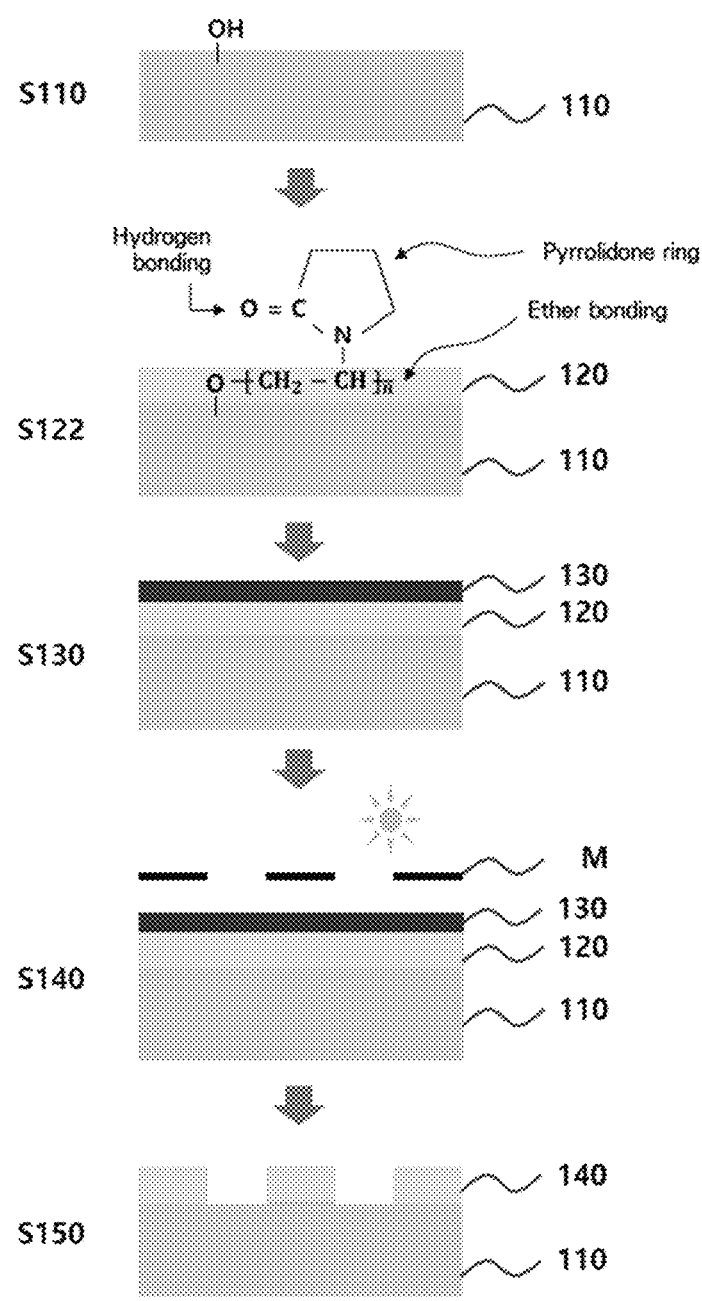
FIG. 1 illustrates a schematic diagram of a method of directly patterning on a stretchable substrate according to an embodiment of the present disclosure.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated steps, but do not preclude the presence or addition of one or more other components and/or steps thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

A method of directly pattering on a stretchable substrate according to an embodiment of the present disclosure includes a step of forming a hydrophilic group on a surface of a stretchable substrate by UV-ozone treatment; a step of forming at least one layer to be etched on the hydrophilic group-formed stretchable substrate, wherein the at least one layer to be etched includes an adhesion enhancing material; a step of forming a photoresist layer on the at least one layer to be etched; exposing a photoresist layer; and a step of patterning the at least one layer to be etched using the exposed photoresist layer, wherein a carbon chain included in the adhesion enhancing material forms ether bonding (R—O—R) with the hydrophilic group formed on the surface of the stretchable substrate.

Preferably, a vinyl chain, which are a carbon chain included in the adhesion enhancing material, is combined with the hydrophilic group formed on the surface of the stretchable substrate so that a pyrrolidone ring may be formed on a surface of the at least one layer to be etched.

Accordingly, a stretchable substrate has low adhesive force to other materials due to high surface stability thereof so that it is difficult to coat other materials in the form of thin film on a surface thereof (in particular, it is difficult to coat with a photoresist layer, and thus, it is impossible to perform a photolithography process), but the method of directly pattering on a stretchable substrate according to an embodiment of the present disclosure may increase binding force between a stretchable substrate and a layer to be etched through binding between the surface-modified stretchable substrate and an adhesion enhancing material included in the at least one layer to be etched so that a photolithography process may be directly performed on the stretchable substrate.

In particular, in the case of existing methods of forming a pattern on a stretchable substrate, a layer to be etched is patterned on a hard substrate such as glass to form a pattern, and then the pattern is transferred onto a stretchable substrate. On the other hand, in the case of the method of directly pattering on a stretchable substrate according to an embodiment of the present disclosure, a photolithography process is directly performed on a stretchable substrate. Accordingly, the method of the present disclosure is simple to existing technologies, and a variety of desired patterns may be formed on a stretchable substrate. Therefore, the method of the present disclosure may be utilized in various fields including the medical field such as biosignal extraction through electrocardiogram and electromyography, and the electronic devices such as flexible displays, touchpads, energy devices, and solar cells.

The at least one layer to be etched may have a single layer structure or a multilayer structure in which at least one or more layers are stacked. When the layer to be etched is formed to have a multilayer structure, at least one of layers including an adhesion enhancing material is formed to be in contact with the hydrophilic group-formed stretchable substrate, so that adhesive force of the stretchable substrate may be improved.

According to an embodiment, the step of forming at least one layer to be etched on the hydrophilic group-formed stretchable substrate, wherein the at least one layer to be etched includes an adhesion enhancing material may include: a step of preparing a first solution including an adhesion enhancing material and a solvent; and the step of coating the first solution on the hydrophilic group-formed stretchable substrate to form a first layer to be etched.

According to an embodiment, the step of forming at least one layer to be etched on the hydrophilic group-formed stretchable substrate, wherein the at least one layer to be etched includes an adhesion enhancing material may include: a step of preparing a first solution including an adhesion enhancing material and a solvent; a step of coating the first solution on the hydrophilic group-formed stretchable substrate to form a first layer to be etched; and a step of at least one second layer to be etched on the first layer to be etched.

According to an embodiment, the step of forming at least one layer to be etched on the hydrophilic group-formed stretchable substrate, wherein the at least one layer to be etched includes an adhesion enhancing material may include: a step of preparing a second solution including metal nanowires and an adhesion enhancing material by adding the adhesion enhancing material during synthesis of metal nanowires; a step of coating the second solution on the hydrophilic group-formed stretchable substrate to form a third layer to be etched; and a step of forming a fourth layer to be etched including a metal on the third layer to be etched.

That is, the step of forming at least one layer to be etched including an adhesion enhancing material on at least one layer may include a technology of forming the first layer to be etched using a first solution only containing an adhesion enhancing material (hereinafter referred to as a method of directly patterning on a stretchable substrate according to an embodiment of the present disclosure), a technology of forming at least one second layer to be etched between a first layer to be etched, fabricated using a first solution only containing an adhesion enhancing material, and a photoresist layer (hereinafter referred to as a method of directly patterning on a stretchable substrate according to another embodiment of the present disclosure), and a technology of forming a third layer to be etched using a second solution prepared by mixing an adhesion enhancing material and metal nanowires in a solution (hereinafter referred to as a method of directly patterning on a stretchable substrate according to yet another embodiment of the present disclosure).

The method of directly patterning on a stretchable substrate according to an embodiment of the present disclosure, the method of directly patterning on a stretchable substrate according to yet another embodiment of the present disclosure, and the method of directly patterning on a stretchable substrate according to yet another embodiment of the present disclosure may include the same components. The method of directly patterning on a stretchable substrate according to an embodiment of the present disclosure is described in detail with reference to FIG. 1, the method of directly patterning on a stretchable substrate according to another embodiment of the present disclosure is described in detail with reference to FIG. 3, and the method of directly patterning on a stretchable substrate according to yet another embodiment of the present disclosure is described in detail with reference to FIG. 4.

FIG. 1 illustrates a schematic diagram of a method of directly patterning on a stretchable substrate according to an embodiment of the present disclosure.

The method of directly patterning on a stretchable substrate according to an embodiment of the present disclosure may include a step (S110) of forming a hydrophilic group on a surface of a stretchable substrate 110 through UV-ozone treatment, a step (S121) of preparing a first solution including an adhesion enhancing material and a solvent, a step (S122) of coating a first solution on the hydrophilic group-formed stretchable substrate 110 to form a first layer to be etched 120, a step (S130) of forming a photoresist layer 130 on the first layer to be etched 120, a step (S140) of exposing the photoresist layer 130, and a step S150 of patterning the first layer to be etched 120 using the exposed photoresist layer 130.

The method of directly patterning on a stretchable substrate according to an embodiment of the present disclosure may include the step (S110) of forming a hydrophilic group on a surface of the stretchable substrate 110 through UV-ozone treatment.

The stretchable substrate 110 may include at least one of polydimethylsiloxane (PDMS), silicon rubber, polyurethane (PU), polyimide (PI), polyethyleneterephthalate (PET), polyethylene naphthalate (PEN), epoxy and Teflon.

Preferably, as the stretchable substrate 110, polydimethylsiloxane (PDMS) having excellent elasticity and biocompatibility may be used. PDMS is a chain polymer material composed of silicon and oxygen atoms and is called silicone rubber. In addition, PDMS has excellent heat resistance, cold resistance, chemical resistance, oil resistance, and the like, is transparent, and has elasticity, thereby being utilized in various fields.

A hydrophilic group may be formed on a surface of the stretchable substrate 110 by UV-ozone treatment, thereby improving surface adhesion between the stretchable substrate 110 and the at least one layer to be etched 120 or photoresist layer 130 formed in subsequent processes.

The hydrophilic group may be at least one of —OH group, —OOH group, and —OO— group. Preferably, the hydrophilic group may be —OH group.

UV-ozone treatment is a method of cutting the main chain of a polymer and forming a surface oxidation layer using ultraviolet rays and ozone generated by irradiation with ultraviolet rays. Adhesive force may be further improved by forming an oxide layer on a hydrophobic surface using ultraviolet irradiation to make it hydrophilic, or by cutting a polymer main chain to create irregularities.

In the method of directly patterning on a stretchable substrate according to an embodiment of the present disclosure, it is important to control a UV-ozone treatment time so as to prevent elasticity decrease so as while sufficiently forming a hydrophilic group on the surface of the stretchable substrate 110 having excellent surface stability because the elasticity of the stretchable substrate 110 and the amount of the hydrophilic group are controlled according to the UV-ozone treatment time.

Accordingly, the UV-ozone treatment time may be 20 minutes to 60 minutes. When the UV-ozone treatment time is less than 20 minutes, a hydrophilic group may not be sufficiently formed on the surface of the stretchable substrate 110, so that adhesion to the adhesion enhancing material may not be stably formed. When the UV-ozone treatment time exceeds 60 minutes, the elasticity of the stretchable substrate 110 may be decreased.

More specifically, the elasticity of the stretchable substrate 110 may be controlled according to the UV-ozone treatment time. When the UV-ozone treatment time increases, the thickness of the surface oxidation layer formed on the surface of the stretchable substrate 110 may increases, so that a surface oxide layer may be wrinkled and thus may have a stiff property.

Accordingly, elasticity may be decreased as the thickness of the surface oxidation layer of the stretchable substrate 110 increases by UV-ozone treatment.

For example, when the UV-ozone treatment time is less than 20 minutes, the first layer to be etched 120 is not uniformly formed in a thin film shape, and when the UV-ozone treatment time exceeds 60 minutes, the elasticity of the stretchable substrate 110 decreases. However, when the UV-ozone treatment time is 30 minutes, the hydrophilic group is not sufficiently formed on the surface of the stretchable substrate 110 and, at the same time, the elasticity of the stretchable substrate 110 is not decreased.

Next, the step (S121) of preparing a first solution including an adhesion enhancing material and a solvent which is included in the method of directly patterning on a stretchable substrate according to an embodiment of the present disclosure may be performed.

The first solution may include an adhesion enhancing material and a solvent. The adhesion enhancing material may include polyvinylpyrrolidone (PVP).

A solvent included in the first solution may be any hydrophilic solvents without specific limitation so long as the stretchable substrate 110 is not directly affected. Preferably, the solvent included in the first solution may include at least any one of ethanol, water, isopropanol and methanol. These materials may be used alone or as a mixture of two or more thereof. Preferably, the solvent may include ethanol.

In addition, when a thin film is formed by spin coating, the viscosity of the solvent included in the first solution should be considered so as to easily form a thin film having a desired thickness.

Since the first layer to be etched 120 is used as an adhesive force-enhancing layer for improving the adhesive force between the stretchable substrate 110 and the photoresist layer 130, the first layer to be etched 120 should be formed to have a sufficiently thin thickness. Since the thickness of the first layer to be etched 120 is adjusted depending upon the viscosity of the first solution for forming the first layer to be etched 120, the thickness of the first layer to be etched 120 may be controlled by adjusting the viscosity of the first solution.

In addition, since the viscosity of the first solution is adjusted depending upon the concentration of the first solution, the thickness of the first layer to be etched 120 may be controlled by adjusting the concentration of the first solution.

Accordingly, the concentration of the first solution may be 5 wt % to 15 wt %. When the concentration of the first solution is out of 5 wt % to 15 wt %, the photoresist layer 130 is not uniformly formed on the surface of the first layer to be etched 120, so that the adhesive force of the first layer to be etched 120 and the photoresist layer 130 may be decreased. In particular, when the concentration of the first solution exceeds 15 wt %, the viscosity of the first solution is very high, so that adhesion enhancing material particles contained in the first solution may be agglomerated, resulting in preventing the photoresist layer 130 from being formed on the surface of the first layer to be etched 120.

Next, the step (S122) of coating a first solution on the hydrophilic group-formed stretchable substrate 110 to form a first layer to be etched 120 of the method of directly patterning on a stretchable substrate according to an embodiment of the present disclosure may be performed.

The first layer to be etched 120 may be coated by at least one method of spin coating, flexible coating, roll coating, slit and spin coating, slit coating, spray coating, roll to roll, bar coating, dip coating, casting, die coating, blade coating, gravure coating and doctor coating.

A pyrrolidone ring included in the adhesion enhancing material may form ether bonding (R—O—R) with a hydrophilic group formed in the surface of the stretchable substrate 110 so that the adhesive force between the first layer to be etched 120 and the stretchable substrate 110 may be improved.

In addition, a vinyl chain included in adhesion enhancing material binds with the hydrophilic group formed in the surface of the stretchable substrate 110 so that a pyrrolidone ring may be formed on the surface of the first layer to be etched 120. In addition, the adhesion enhancing material forms a hydrogen bond with the photoresist layer 130, which is formed in a subsequent process, by oxygen contained in the pyrrolidone ring, so that the binding force between the first layer to be etched 120 and the photoresist layer 130 increases. Finally, a photolithography process is directly performed on the stretchable substrate 110 by improving the binding force between the stretchable substrate 110 and the photoresist layer 130.

Preferably, the low surface adhesion problem of the stretchable substrate 110 may be addressed due to hydrogen bonding by oxygen present in a pyrrolidone ring of polyvinylpyrrolidone (PVP) used as an adhesion enhancing material.

Next, the step (S130) of forming the photoresist layer 130 on the first layer to be etched 120 of the method of directly patterning on a stretchable substrate according to an embodiment of the present disclosure may be performed.

In S130, a photoresist is applied onto the first layer to be etched 120, and then the photoresist-applied stretchable substrate 110 is heated and dried (pre-baked), or heated after drying under reduced pressure, thereby forming the photoresist layer 130.

The photoresist-applied stretchable substrate 110 may be heated to volatilize volatile components such as solvent. Here, the heating temperature may be 70 to 100° C. which are relatively low temperatures, and the heating and drying (pre-baking) may be performed at 110° C. for 2 minutes.

The photoresist layer 130 may be coated by at least one method of spin coating, flexible coating, roll coating, slit and spin coating, slit coating, spray coating, roll to roll, bar coating, dip coating, casting, die coating, blade coating, gravure coating and doctor coating.

Next, the step (S140) of exposing the photoresist layer 130 of the method of directly patterning on a stretchable substrate according to an embodiment of the present disclosure may be performed.

S140 is a step of exposing the photoresist layer 130 using a mask M engraved with a target pattern. The exposing may be performed by irradiating the photoresist layer 130 with ultraviolet rays using the mask M for forming a target pattern. Here, when the photoresist layer 130 is irradiated with ultraviolet rays, the chemical structure of a photoresist in a region irradiated with ultraviolet rays is changed, so that the photoresist may be easily dissolved in a developing solution.

For example, the irradiating with ultraviolet rays may be performed for 12 seconds.

Finally, the step S150 of patterning the first layer to be etched 120 using the exposed photoresist 130 of the method of directly patterning on a stretchable substrate according to an embodiment of the present disclosure is performed.

In S150, the exposed photoresist layer 130 is developed using a developing solution, and then the first layer to be etched 120, except for the formed target pattern, is etched and washed using an etching liquid, thereby forming a first etched layer pattern 140.

Accordingly, the method of directly patterning on a stretchable substrate according to an embodiment of the present disclosure includes forming the first layer to be etched 120 using the first solution including an adhesion enhancing material, so that the adhesive force between the stretchable substrate 110 and the first layer to be etched 120 and the adhesive force between the first layer to be etched 120 and the photoresist layer 130 are improved. Accordingly, a third layer to be etched 120 may be directly patterned on the stretchable substrate 110.

Figure 2:
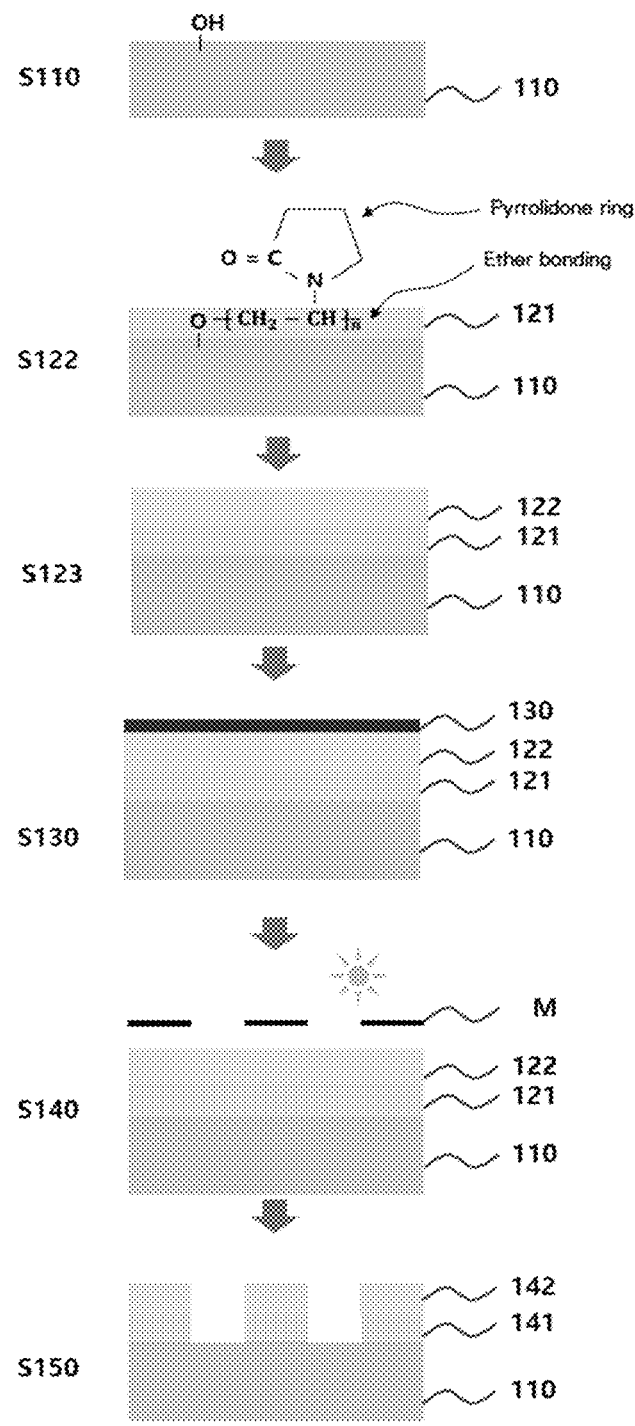
FIG. 2 illustrates a schematic diagram of a method of directly patterning on a stretchable substrate according to another embodiment of the present disclosure.

FIG. 2 illustrates a schematic diagram of a method of directly patterning on a stretchable substrate according to another embodiment of the present disclosure.

The method of directly patterning on a stretchable substrate according to another embodiment of the present disclosure may include a step (S110) of forming a hydrophilic group on a surface of a stretchable substrate 110 through UV-ozone treatment, a step (S121) of preparing a first solution including an adhesion enhancing material and a solvent, a step (S122) of coating a first solution on the hydrophilic group-formed stretchable substrate 110 to form a first layer to be etched 121, a step (S123) of forming at least one second layer to be etched 122 on the first layer to be etched 121, a step (S130) of forming a photoresist layer 130 on the at least one second layer to be etched 122, a step (S140) of exposing the photoresist layer 130, and a step (S150) of patterning the first layer to be etched 121 and the at least one second layer to be etched 122 using the exposed photoresist layer 130.

The method of directly patterning on a stretchable substrate according to another embodiment of the present disclosure is the same as the method of directly patterning on a stretchable substrate according to an embodiment of the present disclosure except that the at least one second layer to be etched 122 is formed on the first layer to be etched 121 before the step (S130) of forming the photoresist layer 130. Therefore, the same components are omitted.

The at least one second layer to be etched 122 formed on the first layer to be etched 121 may be formed using the adhesion enhancing material of the first layer to be etched 121 and a material having excellent adhesive force.

The adhesion enhancing material and the material having excellent adhesive force may be a material having a hydrophilic group, preferably, at least one of metal nanowires and metals.

The metal nanowires may include at least one of silver (Ag) nanowires, copper (Cu) nanowires, aluminum (Al) nanowires, gold (Au) nanowires, platinum (Pt) nanowires, nickel (Ni) nanowires and titanium (Ti) nanowires. Preferably, the metal nanowires may be silver nanowires.

The second layer to be etched 122 may include metal nanowires, so that the metal nanowires form a network structure. Accordingly, electrical properties may be improved.

More specifically, a thin film is randomly formed on the metal nanowires by coating, and in this process, overlapping junctions between the metal nanowires are generated. When the coated metal nanowires are annealed in a subsequent process, the overlapping junctions between the metal nanowires are induced to be sintered, so that the metal nanowires may have a network structure.

Accordingly, the step (S130) of forming a photoresist layer 130 on the at least one second layer to be etched 122 may include a step of annealing the second layer to be etched 122 on the hydrophilic group-formed stretchable substrate 110.

The metal may be a metal with a low resistance. Preferably, the metal may be noble metal. More preferably, the metal may include at least one of gold (Au), silver (Ag), aluminum (Al), platinum (Pt), and copper (Cu). Even more preferably, the metal may include gold (Au).

The second layer to be etched 122 may be coated by at least one method of spin coating, flexible coating, roll coating, slit and spin coating, slit coating, spray coating, roll to roll, bar coating, dip coating, casting, die coating, blade coating, gravure coating, doctor coating, vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy and sputtering.

In the method of directly patterning on a stretchable substrate according to another embodiment of the present disclosure, the at least one second layer to be etched 122 is formed using an adhesion enhancing material and a material having excellent adhesive force, so that the at least one second layer to be etched 122 may be directly patterned on the stretchable substrate 110.

For example, the adhesion enhancing material may become hydrophilic by oxygen contained in a pyrrolidone ring thereof, so that adhesive force to the second layer to be etched 122 may increase.

More specifically, since the metal included in the second layer to be etched 122 has a hydrophilic property and thus the second layer to be etched 122 has a hydrophilic property due to a hydrogen bond-binding oxygen (oxygen contained in a pyrrolidone ring) in the adhesion enhancing material thereof, the first layer to be etched 121 may easily adhere to the second layer to be etched 122 having hydrophilic property.

Accordingly, since the first layer to be etched 121 according to the method of directly patterning on a stretchable substrate according to another embodiment of the present disclosure includes an adhesion enhancing material, the adhesive force between the stretchable substrate 110 and the second layer to be etched 122 may be further improved.

In S150, the exposed photoresist layer 130 may be developed using a developing solution, and then the first layer to be etched 121 and second layer to be etched 122, except for the formed target pattern, may be etched and washed using an etching liquid, thereby forming a first etched layer pattern 141 and a second etched layer pattern 142.

Accordingly, the high surface stability property problem of the stretchable substrate 110 may be addressed by the method of directly patterning on a stretchable substrate according to another embodiment of the present disclosure, so that a stretchable electrode having a double-layer structure (a structure including the first and second layers to be etched) may be fabricated.

The stretchable electrode according to an embodiment of the present disclosure may include a stretchable substrate 110 whose surface includes a hydrophilic group; and a first electrode pattern (first etched layer pattern; 141) and second electrode pattern (second etched layer pattern; 142) which are formed on the stretchable substrate 110 whose surface includes a hydrophilic group and which include an adhesion enhancing material.

The carbon chain included in the adhesion enhancing material of the first electrode pattern 141 forms ether bonding (R—O—R) with a hydrophilic group formed in the surface of the stretchable substrate 110 so that the adhesive force between the second electrode pattern 142 and the stretchable substrate 110 may be improved.

In addition, the vinyl chain included in the adhesion enhancing material of the first electrode pattern 141 binds to the hydrophilic group formed on the surface of the stretchable substrate 110 so that a pyrrolidone ring may be formed on the surface.

The adhesion enhancing material may become hydrophilic due to oxygen included in the pyrrolidone ring, so that adhesive force to the second etched electrode 122 having hydrophilic properties may be improved.

For example, when polyvinylpyrrolidone (PVP) is used as the adhesion enhancing material, the low surface adhesion problem of the stretchable substrate 110 may be addressed through hydrogen bonding by oxygen present in a pyrrolidone ring of polyvinylpyrrolidone.

Accordingly, in the stretchable electrode according to an embodiment of the present disclosure, the width of each of the first and second electrode patterns 141 and 142 including the adhesion enhancing material may be at least 10 µm. When the width of each of the first and second electrode patterns 141 and 142 including the adhesion enhancing material is less than 10 µm, the patterns may be destroyed by an etching liquid.

Figure 3:
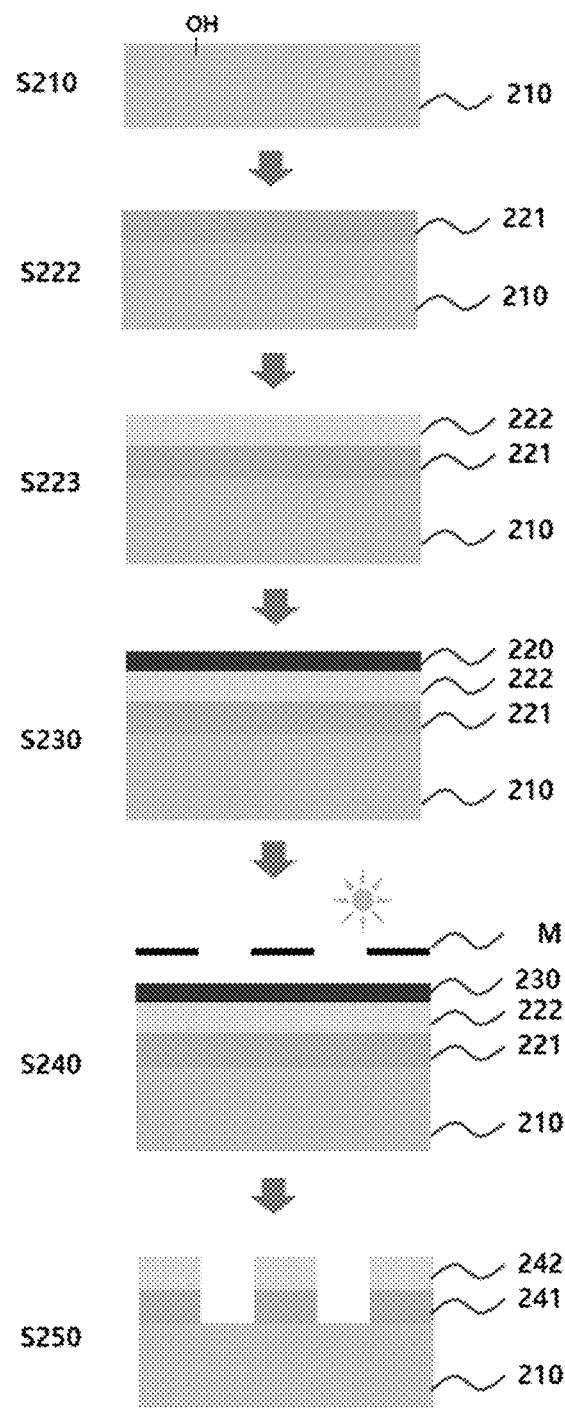
FIG. 3 illustrates a schematic diagram of a method of directly patterning on a stretchable substrate according to yet another embodiment of the present disclosure.

FIG. 3 illustrates a schematic diagram of a method of directly patterning on a stretchable substrate according to yet another embodiment of the present disclosure.

The method of directly patterning on a stretchable substrate according to yet another embodiment of the present disclosure may include the same components as in the method of directly patterning on a stretchable substrate according to an embodiment of the present disclosure. Accordingly, description of the same components is omitted.

The method of directly patterning on a stretchable substrate according to yet another embodiment of the present disclosure may include a step (S210) of forming a hydrophilic group on a surface of a stretchable substrate 210 by UV-ozone treatment, a step (S221) of preparing a second solution including metal nanowires and an adhesion enhancing material by adding an adhesion enhancing material during synthesis of metal nanowires, a step (S222) of coating the second solution on the hydrophilic group-formed stretchable substrate 210 to form a third layer to be etched 221, a step (S223) of forming a fourth etched layer 222 including a metal on the third layer to be etched 221, a step (S230) of forming a photoresist layer 230 on the fourth etched layer 222, a step (S240) of exposing the photoresist layer 130 and a step (S250) of patterning the third layer to be etched 221 and the fourth etched layer 222 using the exposed photoresist layer 230.

The method of directly patterning on a stretchable substrate according to yet another embodiment of the present disclosure may include the step (S210) of forming a hydrophilic group on a surface of a stretchable substrate 210 by UV-ozone treatment.

S210 may be performed using the same materials or methods as in the method of directly patterning on a stretchable substrate according to an embodiment of the present disclosure. Therefore, detailed descriptions thereof are omitted.

The method of directly patterning on a stretchable substrate according to yet another embodiment of the present disclosure may include the step (S221) of preparing a second solution including metal nanowires and an adhesion enhancing material by adding an adhesion enhancing material during synthesis of metal nanowires.

The adhesion enhancing material included in the second solution is used to improve the adhesive force between the stretchable substrate 110 and the third layer to be etched 221 and the adhesive force between the third layer to be etched 221 and the third layer to be etched 222, the viscosity of the second solution may be adjusted depending upon the concentration of the adhesion enhancing material included in the second solution so that the uniformity of the third layer to be etched 221 may be improved, the adhesive force between the stretchable substrate 110 and the third layer to be etched 221 and the adhesive force between the third layer to be etched 221 and the third layer to be etched 222 may be uniformly formed by the uniform third layer to be etched 221 so that it is possible to perform stable patterning in a subsequent process.

Accordingly, the adhesive force between the stretchable substrate 110 and the third layer to be etched 221 may be adjusted depending upon the concentration of the adhesion enhancing material included in the second solution, and the concentration of the adhesion enhancing material included in the second solution may be 5 wt % to 15 wt %. When the concentration of the adhesion enhancing material included in the second solution is less than 5 wt %, the adhesive force between the stretchable substrate 210 and the third layer to be etched 221 is insufficient so that it is impossible to stably perform patterning. When the concentration of the adhesion enhancing material included in the second solution exceeds 15 wt %, the viscosity of the second solution is high, and thus, a thin film is not uniformly formed.

The adhesion enhancing material may include polyvinylpyrrolidone (PVP).

The metal nanowires may include at least one of silver (Ag) nanowires, copper (Cu) nanowires, aluminum (Al) nanowires, gold (Au) nanowires, platinum (Pt) nanowires, nickel (Ni) nanowires and titanium (Ti) nanowires. Preferably, the metal nanowires may be silver nanowires.

For example, when silver nanowires are used as metal nanowires, the second solution may be prepared by synthesizing nanowires from a reaction mixture containing silver nitrate ($AgNO_3$), oleylamine, and oleic acid, and then adding an adhesion enhancing material to the synthesized silver nanowires.

The second solution may further include a solvent. A solvent included in the second solution may be any hydrophilic solvents without specific limitation so long as the stretchable substrate 110 is not directly affected. Preferably, the solvent included in the second solution may include at least any one of ethanol, water, isopropanol and methanol. These materials may be used alone or as a mixture of two or more thereof. Preferably, the solvent may include ethanol.

The second solution may include metal nanowires and adhesion enhancing material dispersed in the solvent. The adhesion enhancing material may be formed on a surface of the metal nanowires.

More specifically, oxygen contained in the pyrrolidone ring of the adhesion enhancing material may be bonded to the surface of the metal nanowires (Ag—O coordination).

The method of directly patterning on a stretchable substrate according to yet another embodiment of the present disclosure may include the step (S222) of coating the second solution on the hydrophilic group-formed stretchable substrate 210 to form a third layer to be etched 221.

Accordingly, the carbon chain included in the adhesion enhancing material of the third layer to be etched 221 forms ether bonding (R—O—R) with the hydrophilic group formed on the surface of the stretchable substrate 210 so that the adhesive force between the third layer to be etched 221 and the stretchable substrate 210 may be improved.

In addition, the vinyl chain contained in the adhesion enhancing material of the third layer to be etched 221 binds to the hydrophilic group formed on the surface of the stretchable substrate 210 so that a pyrrolidone ring may be formed on the surface of the third layer to be etched 120.

Accordingly, the adhesion enhancing material is hydrophilic due to oxygen contained in the pyrrolidone ring, thereby improving adhesive force to a fourth layer to be etched 222 formed in a subsequent process. Finally, binding force between the stretchable substrate 210 and the fourth layer to be etched 222 increases so that a photolithography process may be directly performed on the stretchable substrate 210.

The third layer to be etched 221 may be coated by at least one method of spin coating, flexible coating, roll coating, slit and spin coating, slit coating, spray coating, roll to roll, bar coating, dip coating, casting, die coating, blade coating, gravure coating and doctor coating.

The second layer to be etched 122 may include metal nanowires, so that the metal nanowires form a network structure. Accordingly, electrical properties may be improved.

More specifically, a thin film is randomly formed on the metal nanowires by coating, and in this process, overlapping junctions between the metal nanowires are generated. When the coated metal nanowires are annealed in a subsequent process, the overlapping junctions between the metal nanowires are induced to be sintered, so that the metal nanowires may have a network structure.

Accordingly, the step (S222) of coating the second solution on the hydrophilic group-formed stretchable substrate 210 to form a third layer to be etched 221 may include a step of coating the second solution on the hydrophilic group-formed stretchable substrate 210; and a step of annealing the second solution coated on the hydrophilic group-formed stretchable substrate 210 to form the third layer to be etched 221 including a network structure.

Next, the step (S223) of forming a fourth etched layer 222 including a metal on the third layer to be etched 221 of the method of directly patterning on a stretchable substrate according to yet another embodiment of the present disclosure may be performed.

The adhesion enhancing material is hydrophilic due to oxygen included in the pyrrolidone ring thereof, thereby increasing adhesive force to the fourth layer to be etched 222.

More specifically, since the metal included in the third layer to be etched 222 is hydrophilic due to oxygen (oxygen contained in a pyrrolidone ring), capable of binding to hydrogen, of the adhesion enhancing material formed on the surface of the metal nanowires, the third layer to be etched 221 may easily adhere to a forth layer to be etched 222 having hydrophilic property.

Accordingly, the adhesive force between the metal nanowires and the metal is excellent due to the metal-metal bonding and, at the same time, the adhesive force between the third layer to be etched 221 and the fourth layer to be etched 222 may be further improved because an adhesion enhancing material is formed on the surface of the metal nanowires by the method of directly patterning on a stretchable substrate according to yet another embodiment of the present disclosure.

The fourth layer to be etched 222 may be formed by any one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy and sputtering.

The metal may be a metal with a low resistance. Preferably, the metal may be noble metal. More preferably, the metal may include at least one of gold (Au), silver (Ag), aluminum (Al), platinum (Pt), and copper (Cu). Even more preferably, the metal may include gold (Au).

Next, the step (S230) of forming a photoresist layer 230 on the fourth etched layer 222 of the method of directly patterning on a stretchable substrate according to yet another embodiment of the present disclosure may be performed.

A photoresist layer 230 may be coated by at least one method of spin coating, flexible coating, roll coating, slit and spin coating, slit coating, spray coating, roll to roll, bar coating, dip coating, casting, die coating, blade coating, gravure coating and doctor coating.

In S230, a photoresist is applied onto the fourth layer to be etched 222, and then the photoresist-applied stretchable substrate 210 is heated and dried (pre-baked), or heated after drying under reduced pressure, thereby forming the photoresist layer 230.

The photoresist-applied stretchable substrate 210 may be heated to volatilize volatile components such as a solvent. Here, the heating temperature may be 70 to 100° C. which are relatively low temperatures, and the heating and drying (pre-baking) may be performed at 110° C. for 2 minutes.

Next, the step (S240) of exposing the photoresist layer 230 of the method of directly patterning on a stretchable substrate according to yet another embodiment of the present disclosure may be performed.

S240 is a step of exposing the photoresist layer 230 using a mask M engraved with a target pattern. The exposing may be performed by irradiating the photoresist layer 230 with ultraviolet rays using the mask M for forming a target pattern. Here, when the photoresist layer 230 is irradiated with ultraviolet rays, the chemical structure of a photoresist in a region irradiated with ultraviolet rays is changed, so that the photoresist may be easily dissolved in a developing solution.

For example, the irradiating with ultraviolet rays may be performed for 12 seconds. Finally, the step (S250) of patterning the third layer to be etched 221 and the fourth etched layer 222 using the exposed photoresist layer 230 of the method of directly patterning on a stretchable substrate according to yet another embodiment of the present disclosure may be performed.

In S250, the exposed photoresist layer 230 is developed using a developing solution, and then the third layer to be etched 221 and the fourth etched layer 222, except for the formed target pattern, are etched and washed using an etching liquid, thereby forming a third etched layer pattern 241 and a fourth etched layer pattern 242.

Accordingly, the high surface stability property problem of the stretchable substrate 210 may be addressed by the method of directly patterning on a stretchable substrate according to yet another embodiment of the present disclosure, so that a stretchable electrode having a double-layer structure (a structure including the third and fourth etched layers) may be fabricated.

The stretchable electrode according to another embodiment of the present disclosure includes the stretchable substrate 210 whose surface contains a hydrophilic group; a metal nanowire pattern (a first electrode including an adhesion enhancing material; a third etched layer pattern; 241) formed on the stretchable substrate 210 whose surface contains a hydrophilic group; and a metal pattern (a second electrode; a fourth etched layer pattern; 242) formed on the metal nanowires pattern (a first electrode including an adhesion enhancing material; a third etched layer pattern; 241).

The carbon chain included in the adhesion enhancing material formed on the surface of the metal nanowires forms ether bonding (R—O—R) with a hydrophilic group formed in the surface of the stretchable substrate 210 so that the adhesive force between the metal nanowire pattern 241 and the stretchable substrate 210 may be improved.

In addition, the vinyl chain contained in the adhesion enhancing material formed the surface of the metal nanowires binds to the hydrophilic group formed on the surface of the stretchable substrate 210 so that a pyrrolidone ring may be formed on the surface of the metal nanowire pattern 241.

The adhesion enhancing material may become hydrophilic due to oxygen included in the pyrrolidone ring, so that adhesive force to the metal film 222 having hydrophilic properties may be improved.

For example, when polyvinylpyrrolidone (PVP) is used as the adhesion enhancing material, the low surface adhesion problem of the stretchable substrate 210 may be addressed through hydrogen bonding by oxygen present in a pyrrolidone ring of polyvinylpyrrolidone.

Accordingly, the width of each of the metal nanowire pattern 241 and metal pattern 242 formed by patterning the double layer including the metal nanowire film and the metal film may be at least 10 µm. When the width of each of the metal nanowire pattern 241 and metal pattern 242 is less than 10 µm, the patterns may be destroyed by an etching liquid.

Figure 4:
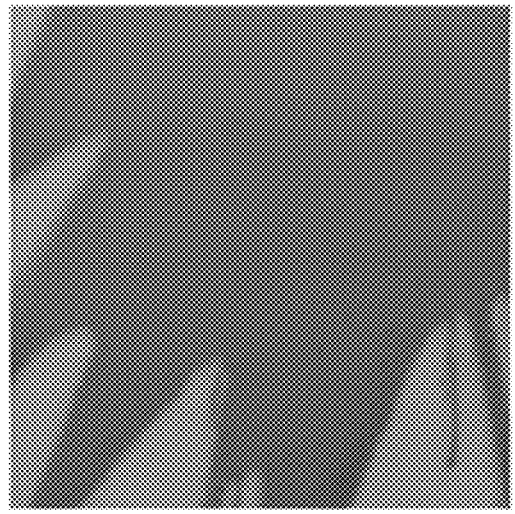
FIG. 4 is an image illustrating a photoresist layer formed on a first layer to be etched that is formed using a 5 wt % first solution.

FIG. 4 is an image illustrating a photoresist layer formed on a first layer to be etched that is formed using a 5 wt % first solution.

The photoresist layer of FIG. 4 was formed by spin-coating a 5 wt % first solution (PVP+ethanol) so as to form a first layer to be etched (PVP film) after performing UV-ozone treatment on a stretchable substrate (PDMS) for 30 minutes.

Referring to FIG. 4, it can be seen that the photoresist layer is not evenly formed on the entire stretchable substrate.

Figure 5:
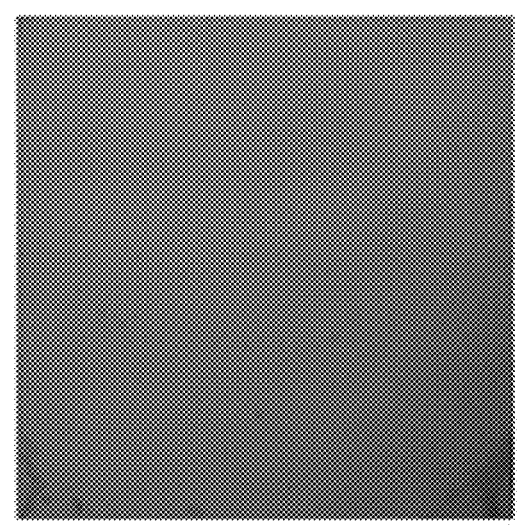
FIG. 5 is an image illustrating a photoresist layer formed on a first layer to be etched that is formed using a 10 wt % first solution (PVP(EtOH) solution)

FIG. 5 is an image illustrating a photoresist layer formed on a first layer to be etched that is formed using a 10 wt % first solution.

The photoresist layer of FIG. 5 was formed by spin-coating a 10 wt % first solution (PVP+ethanol) so as to form a first layer to be etched (PVP film) after performing UV-ozone treatment on a stretchable substrate (PDMS) for 30 minutes.

Referring to FIG. 5, it can be seen that the photoresist layer is stably and uniformly formed on the stretchable substrate.

Figure 6:
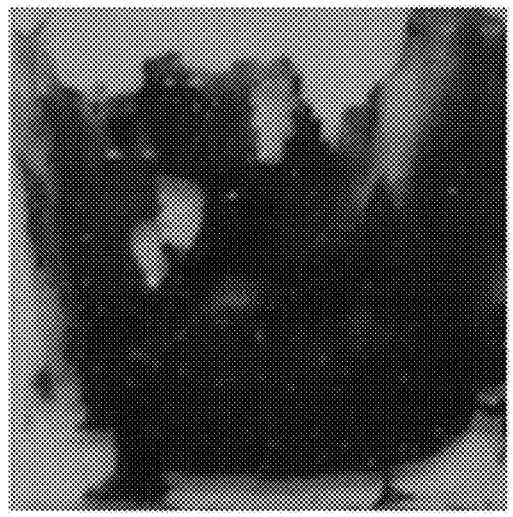
FIG. 6 is an image illustrating a photoresist layer formed on a first layer to be etched that is formed using a 15 wt % first solution (PVP(EtOH) solution)

FIG. 6 is an image illustrating a photoresist layer formed on a first layer to be etched that is formed using a 15 wt % first solution.

The photoresist layer of FIG. 6 was formed by spin-coating a 15 wt % first solution (PVP+ethanol) so as to form a first layer to be etched (PVP film) after performing UV-ozone treatment on a stretchable substrate (PDMS) for 30 minutes.

Referring to FIG. 6, it can be seen that the viscosity of a first solution (PVP(EtOH) solution) is too high, and thus, the photoresist is cured in an agglomerated state, whereby the thin film is not uniformly formed.

Figure 7:
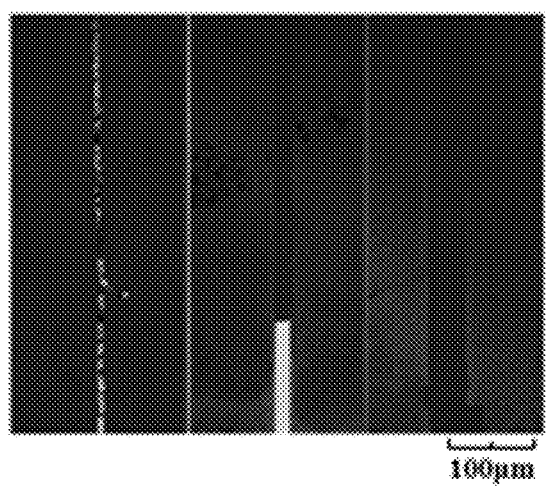
FIG. 7 is an image illustrating a stretchable electrode fabricated in a method of directly patterning a stretchable substrate using a second solution that excludes an adhesion enhancing material.
Figure 8:
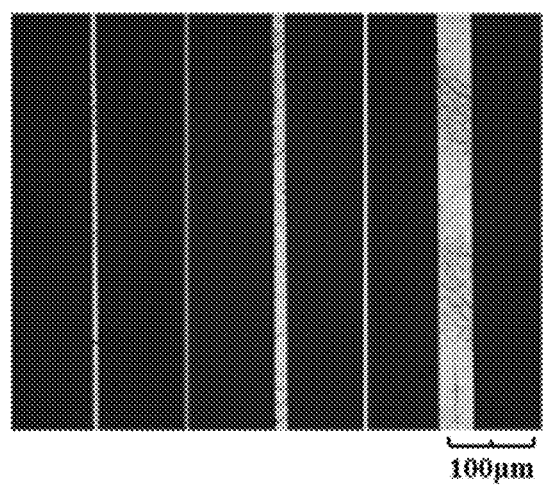
FIG. 8 is an image illustrating a stretchable electrode fabricated by a method of directly patterning on a stretchable substrate according to yet another embodiment of the present disclosure.

FIG. 7 is an image illustrating a stretchable electrode fabricated in a method of directly patterning a stretchable substrate using a second solution that excludes an adhesion enhancing material (not including PVP), and FIG. 8 is an image illustrating a stretchable electrode fabricated by a method of directly patterning on a stretchable substrate according to yet another embodiment of the present disclosure (PVP is included in the second solution).

Both the stretchable electrodes of FIGS. 7 and 8 were formed to have a pattern with a width (line width) of 10 µm, 20 µm or 50 µm.

Referring to FIGS. 7 and 8, the stretchable electrode fabricated by directly patterning a stretchable substrate using the second solution excluding an adhesion enhancing material has low adhesive force, thus being lifted off, but the stretchable electrode fabricated by the method of directly patterning on a stretchable substrate according to yet another embodiment of the present disclosure has improved adhesive force so that a pattern having a width (line width) of 10 µm is well formed.

In accordance with embodiments of the present disclosure, provided is a method of using a surface-modified stretchable substrate and at least one layer to be etched including an adhesion enhancing material to improve the adhesive force between the stretchable substrate and the at least one layer to be etched, thus directly patterning the stretchable substrate by a photolithography process.

In accordance with embodiments of the present disclosure, provided are a method of directly pattering a stretchable substrate, particularly a method of directly patterning a double layer formed on a stretchable substrate using a direct photolithography process, and a stretchable electrode fabricated by the method.

Although the present disclosure has been described through limited examples and figures, the present disclosure is not intended to be limited to the examples. Those skilled in the art will appreciate that various modifications, additions and substitutions are possible, without departing from the scope and spirit of the disclosure. Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS 110, 210: stretchable substrate 120: first layer to be etched
130, 230: photoresist layer 140: first etched layer pattern
220: double-layer electrode film 221: third layer to be etched, metal nanowire film
222: third layer to be etched, metal film
241: third etched layer pattern, metal nanowire pattern
242: fourth etched layer pattern, metal pattern

What is claimed is:

1. A method of directly patterning a stretchable substrate, the method comprising:
    forming a hydrophilic group on a surface of a stretchable substrate by UV-ozone treatment;
    forming at least one layer to be etched on the hydrophilic group-formed stretchable substrate, wherein the at least one layer to be etched comprises an adhesion enhancing material;
    forming a photoresist layer on the at least one layer to be etched;
    exposing the photoresist layer; and
    patterning the at least one layer to be etched using the exposed photoresist layer,
    wherein a carbon chain comprised in the adhesion enhancing material forms ether bonding (R—O—R) with a hydrophilic group formed on the surface of the stretchable substrate.

2. The method according to claim 1, wherein the adhesion enhancing material comprises a vinyl chain, wherein the vinyl chain of the adhesion enhancing material binds to the hydrophilic group formed on the surface of the stretchable substrate so that a pyrrolidone ring is formed on surface of the at least one layer to be etched.

3. The method according to claim 2, comprising:
    forming at least one layer to be etched on the hydrophilic group-formed stretchable substrate, wherein the at least one layer to be etched comprises an adhesion enhancing material;
    preparing a first solution comprising the adhesion enhancing material and a solvent; and
    coating the first solution on the hydrophilic group-formed stretchable substrate to form a first layer to be etched.

4. The method according to claim 3, wherein the adhesion enhancing material forms a hydrogen bond with the photoresist layer by oxygen comprised in the pyrrolidone ring.

5. The method according to claim 3, wherein a concentration of the first solution is 5 wt % to 15 wt %.

6. The method according to claim 3, wherein the forming of the at least one layer to be etched on the hydrophilic group-formed stretchable substrate comprises:
    coating the first solution on the hydrophilic group-formed stretchable substrate to form the first layer to be etched; and then
    forming at least one second layer to be etched on the first layer to be etched.

7. The method according to claim 2, wherein the forming of the at least one layer to be etched on the hydrophilic group-formed stretchable substrate comprises:
    adding an adhesion enhancing material during synthesis of metal nanowires to prepare a second solution comprising the metal nanowires and the adhesion enhancing material;
    coating the second solution on the hydrophilic group-formed stretchable substrate to form a third layer to be etched; and
    forming a fourth layer to be etched comprising a metal on the third layer to be etched.

8. The method according to claim 7, wherein the adhesion enhancing material is formed on a surface of the metal nanowires.

9. The method according to claim 8, wherein the adhesion enhancing material becomes hydrophilic by oxygen comprised in the pyrrolidone ring so that adhesive force to a metal film increases.

10. The method according to claim 1, wherein, in the forming of the hydrophilic group on a surface of a stretchable substrate by UV-ozone treatment,
    the UV-ozone treatment is performed for 20 minutes to 60 minutes.

11. The method according to claim 1, wherein the stretchable substrate comprises at least one of polydimethylsiloxane (PDMS), silicon rubber, polyurethane (PU), polyimide(polyimide, PI), polyethyleneterephthalate (PET), polyethylene naphthalate (PEN), epoxy, and Teflon.

12. The method according to claim 1, wherein the adhesion enhancing material comprises polyvinylpyrrolidone (PVP).

* * * * *